United States Patent
Panov et al.

(10) Patent No.: US 7,079,062 B2
(45) Date of Patent: Jul. 18, 2006

(54) HIGH-RESOLUTION DIGITAL-TO-ANALOGUE CONVERTER WITH A SMALL AREA REQUIREMENT

(75) Inventors: Georgi Nikolov Panov, München (DE); Marco Bachhuber, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/036,788

(22) Filed: Jan. 14, 2005

(65) Prior Publication Data

US 2005/0195098 A1 Sep. 8, 2005

(30) Foreign Application Priority Data

Jan. 14, 2004 (DE) ..................... 10 2004 002 013

(51) Int. Cl.
*H03M 1/66* (2006.01)
(52) U.S. Cl. ..................................... 341/144
(58) Field of Classification Search ............... 341/144, 341/154, 141
See application file for complete search history.

(56) References Cited

U.S. PATENT DOCUMENTS

| | | | | | |
|---|---|---|---|---|---|
| 4,543,560 | A | * | 9/1985 | Holloway | 341/133 |
| 4,973,979 | A | * | 11/1990 | Ikeda | 341/154 |
| 5,252,975 | A | | 10/1993 | Yuasa et al. | |
| 5,568,147 | A | | 10/1996 | Matsuda et al. | |
| 5,977,898 | A | * | 11/1999 | Ling et al. | 341/144 |
| 6,163,289 | A | * | 12/2000 | Ginetti | 341/145 |
| 6,288,661 | B1 | * | 9/2001 | Holberg | 341/145 |
| 6,388,599 | B1 | * | 5/2002 | Yamamoto et al. | 341/154 |
| 6,590,514 | B1 | * | 7/2003 | Suzuki | 341/144 |
| 6,778,122 | B1 | * | 8/2004 | Lien | 341/154 |

FOREIGN PATENT DOCUMENTS

DE 101 52 090 A1 11/2002

* cited by examiner

*Primary Examiner*—Peguy JeanPierre
(74) *Attorney, Agent, or Firm*—Eschweiler & Associates, LLC

(57) ABSTRACT

Digital-to-analogue converter for converting a digital input signal into an analogue output signal includes a resistor string with switchable taps, a decoder circuit for connecting or disconnecting the taps in a manner dependent on the digital input signal, and a voltage divider. The voltage divider is operable to generate a divider voltage that divides a voltage difference that occurs between two connectable taps. The analogue output voltage is dependent on the divider voltage generated by the voltage divider.

21 Claims, 2 Drawing Sheets

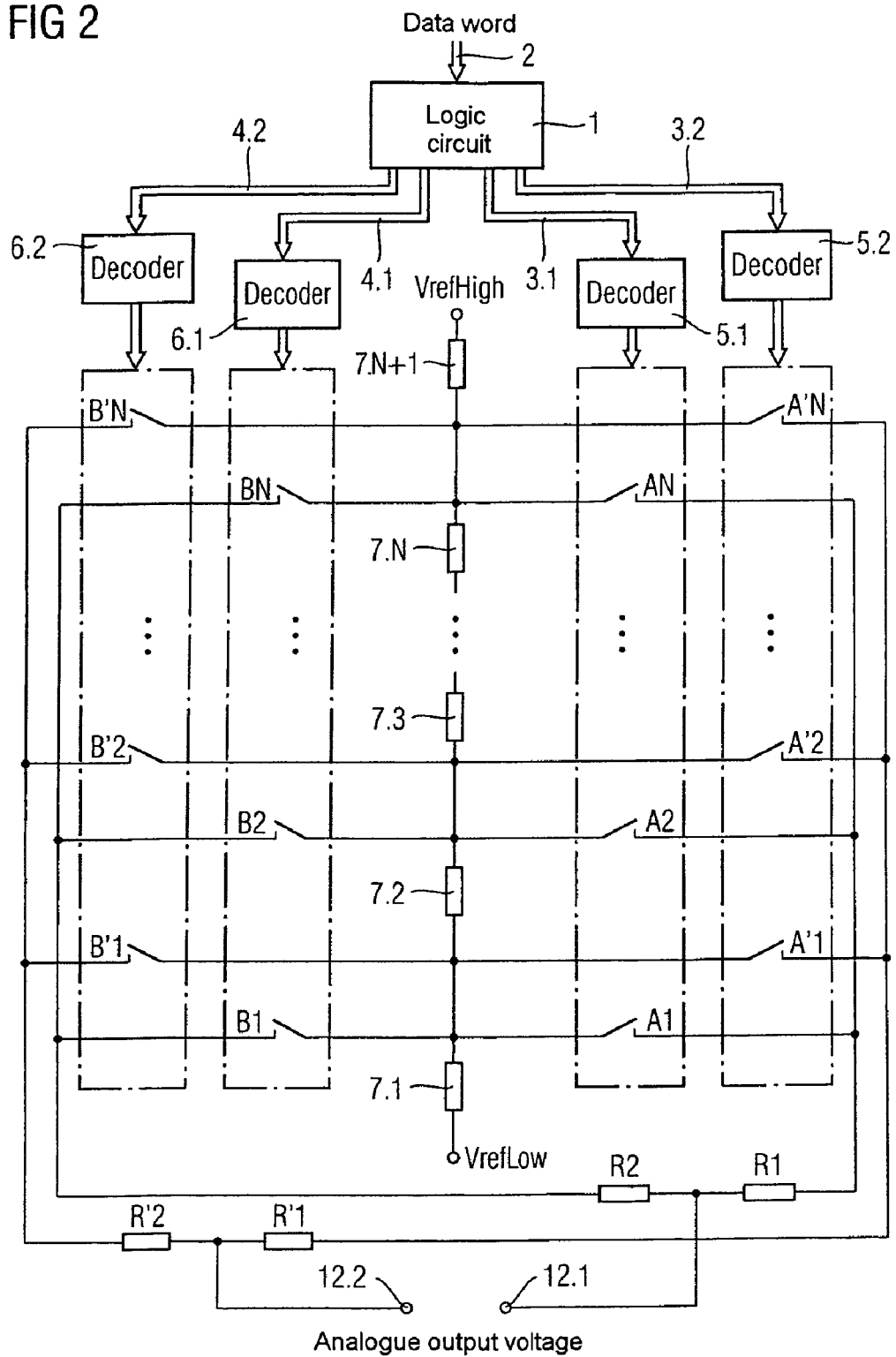

HIGH-RESOLUTION DIGITAL-TO-ANALOGUE CONVERTER WITH A SMALL AREA REQUIREMENT

REFERENCE TO RELATED APPLICATIONS

This application claims the benefit of the priority date of German application DE 10 2004 002 013.2, filed on Jan. 14, 2004, the contents of which are herein incorporated by reference in their entirety.

FIELD OF THE INVENTION

The invention relates to a digital-to-analogue converter for converting a digital input signal into an analogue output signal.

BACKGROUND OF THE INVENTION

Digital-to-analogue converters are known which comprise a voltage divider string in which each digital input word is assigned precisely one tap of said voltage divider string. The taps are switched to the output by means of an arrangement of analogue switches. A decoder drives the analogue switches in such a way that, for each value of the digital input word, the corresponding voltage is present at the output of the digital-to-analogue converter.

In integrated circuits, the voltage divider string is embodied as an extended resistive track on which lateral taps consisting of the same material as the resistive track are situated at regular intervals. At the end of the taps, contacts to metallic interconnects are situated at a sufficiently large distance, so that they have no significant influence on the profile of the current lines in the resistive track. By virtue of this arrangement, the homogeneity of the resistive track is no longer disturbed by the contacts whose contact resistances may have large fluctuations. The static linearity of this arrangement is determined only by the homogeneity of the resistive track and is generally very high. A significant disadvantage of this so-called R-string digital-to-analogue converter consists in the fact that the length of the resistive track increases proportionally to the number of taps. High-resolution digital-to-analogue converters therefore have a very long length or may no longer be able to be realized if their length would exceed the planned dimensions of the chip.

One known solution to this problem involves constructing a high-resolution R-string digital-to-analogue converter from two low-resolution R-string digital-to-analogue converters whose R-string resistors have different orders of magnitude. In this case, the high-resistance digital-to-analogue converters are always connected between two adjacent outputs of the low-resistance digital-to-analogue converter. The resolution of the digital-to-analogue converter realized in this way is the sum of the resolutions of the two underlying digital-to-analogue converters.

This method reduces the area requirement of the entire R-string digital-to-analogue converter. Since a high-resistance R-string with high linearity requires a great deal of area, overall only a relatively slight area gain can be achieved, however.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention comprises a digital-to-analogue converter with a small area requirement and high resolution. In particular, the digital-to-analogue converter according to the invention is realized in a simple and cost-effective manner.

In accordance with one exemplary embodiment of the invention, the digital-to-analogue converter comprises a resistor string with switchable taps and also a decoder circuit for connecting or disconnecting the taps in a manner dependent on the digital input signal. According to the invention, the digital-to-analogue converter furthermore comprises a voltage divider which, in order to generate a divider voltage, divides the voltage difference that occurs between two connectable taps, the analogue output voltage being dependent on the divider voltage generated by the voltage divider.

The voltage divider results in an increase in the resolution (bit accuracy) of the digital-to-analogue converter. In this case, the extent of the increase in resolution is dependent on the divider ratio chosen. The driving for connecting or disconnecting the taps by means of the decoder circuit is effected in such a way that the high-resolution output voltage of the digital-to-analogue converter is formed by interpolation from the output voltages of the underlying digital-to-analogue converter with lower resolution.

In one example, the resistor string is realized with double taps, each tap of a double tap being separately connectable to the resistor string or disconnectable from the latter. The decoder circuit has a first decoder circuit for connecting or disconnecting respective first taps of the double taps and a second decoder circuit for connecting or disconnecting respective second taps of the double taps. The voltage divider is arranged in such a way that it always lies between first and second taps. In this case, the two decoder circuits may be identical to decoder circuits as are used in the prior art for controlling the taps of conventional digital-to-analogue converters. The construction of both the first decoder circuit and the second decoder circuit depends solely on the number of resistors in the resistor string and is not influenced by the resolution of the entire digital-to-analogue converter.

In comparison with the prior art, the high-resolution digital-to-analogue converter requires, instead of an additional resistor string, only a second decoder circuit and also the voltage divider. Since the decoder circuits are digital logic circuits with transistors having a small area requirement, the presence of the additional second decoder circuit (and also the second voltage divider) only slightly increases the overall area requirement of the digital-to-analogue converter with increased resolution according to the invention.

In another example, the digital-to-analogue converter according to the invention is an integrated component of an integrated circuit. In this case, the resistor string is embodied as an extended resistive track in a manner known per se, the taps or the double taps being situated at regular intervals laterally on the resistive track.

A particularly advantageous configuration of the digital-to-analogue converter according to the invention is a differential digital-to-analogue converter, which has a first digital-to-analogue converter with a first group of taps, in particular double taps, for generating a first potential representing the output signal of the first digital-to-analogue converter, and a second digital-to-analogue converter with a second group of taps, in particular double taps, for generating a second potential representing the output signal of the second digital-to-analogue converter, the first and second digital-to-analogue converters comprising a common resistor string and the analogue output voltage of the differential digital-to-analogue converter being dependent on the difference between the two generated potentials.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in more detail below on the basis of two exemplary embodiments with reference to the drawings, in which:

FIG. 2 is a schematic circuit diagram of a differential digital-to-analogue converter according to the invention in accordance with a second exemplary embodiment of the invention.

DETAILED DESCRIPTION OF THE INVENTION

Figure 1:
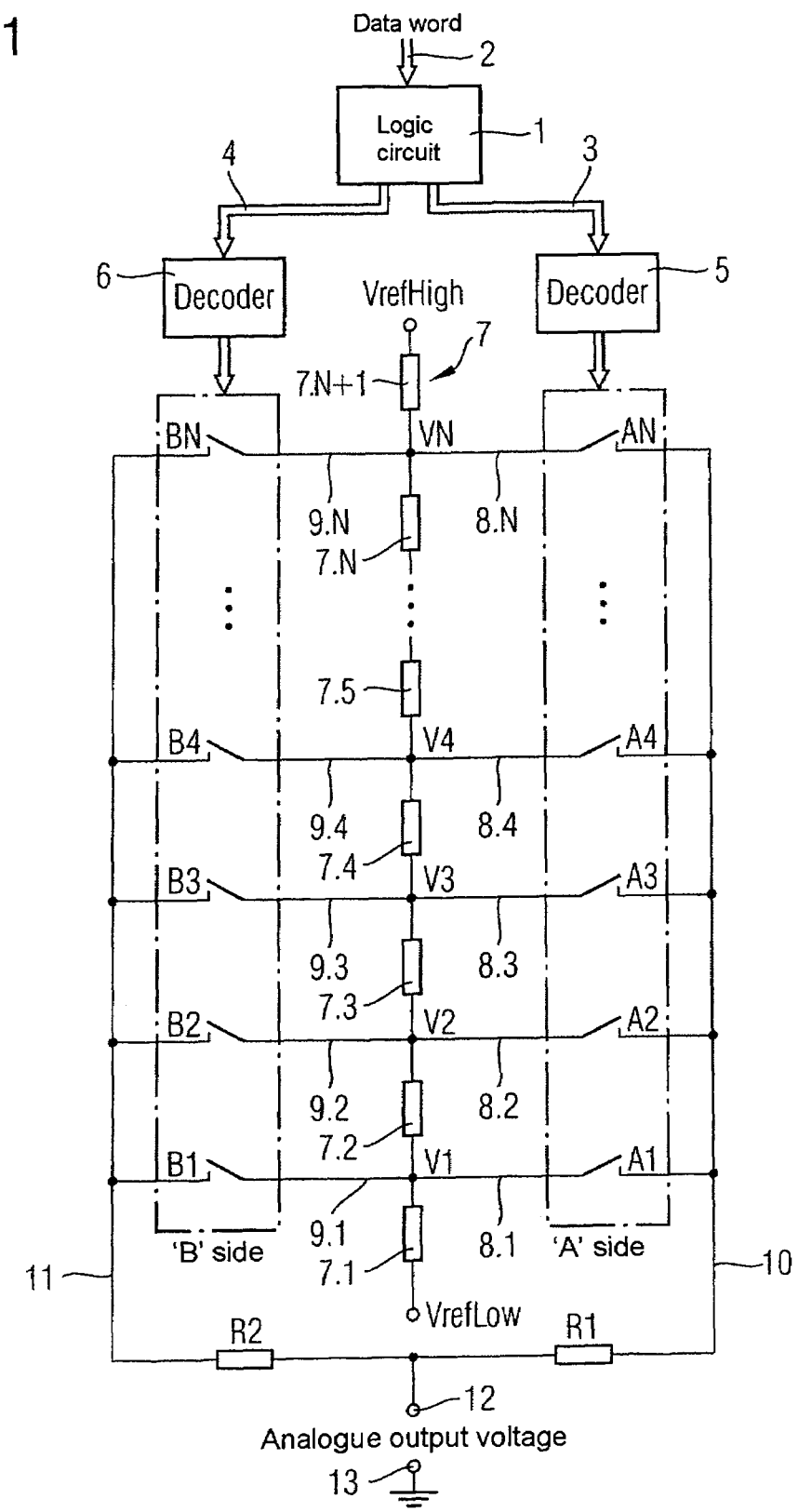
FIG. 1 is a schematic circuit diagram of a first exemplary embodiment of the digital-to-analogue converter according to the invention.

According to FIG. 1, a digital-to-analogue converter DAC according to the invention has a logic circuit 1 with a digital input 2. The logic circuit controls two decoder circuits 5, 6, arranged in parallel with one another, via two data connections 3, 4. A resistor string 7 is at a high potential VrefHigh at one end and at a low potential VrefLow at the other end. In FIG. 1, the resistor string 7 is illustrated as a series circuit of resistors 7.1, 7.2, 7.3, 7.4, 7.5, . . . , 7.N, 7.N+1 which preferably have the same magnitude.

The resistor string 7 is realized as a homogeneous resistive track in an integrated circuit. Situated between the individual resistors 7.1, 7.2, . . . , 7.N, 7.N+1 there are in each case two taps 8.1, 9.1 and 8.2, 9.2 and 8.3, 9.3 and . . . , 8.N, 9.N, respectively, which are in each case connected to the same potential V1 and V2 and V3 and . . . , VN, respectively. The potentials V1, V2, . . . , VN occur between the individual resistors 7.1, 7.2, 7.3, . . . , 7.N+1 of the resistor string 7. Each double tap 8.1, 9.1 and 8.2, 9.2 and 8.3, 9.3 and . . . , 8.N, 9.N has two switches A1, B1 and A2, B2 and A3, B3 and . . . , AN, BN, respectively, arranged oppositely in FIG. 1. The outputs of the switches Ax, x=1, 2, . . . , N, are fed to a common line 10. The outputs of the switches Bx, x=1, 2, . . . , N, are fed to a common line 11. A voltage divider constructed from two resistors R1 and R2 arranged in series is situated between the two lines 10, 11. The output 12 of the voltage divider is situated between the two resistors R1 and R2. The analogue output voltage of the DAC occurs between the output 12 and a basic potential 13, for example ground.

The resistors R1 and R2 of the voltage divider are greater than the resistors 7.1, 7.2, 7.3, . . . , 7.N+1 of the resistor string 7 and greater than the resistances of the activated switches Ax, Bx, x=1, 2, . . . , N (in an integrated embodiment of the DAC according to the invention, the switches Ax, Bx are preferably realized by transistors).

The circuit illustrated in FIG. 1 functions as follows:

Only one respective switch Ax and By, y=1, 2, . . . , N, of the double taps is simultaneously activated. If these activated switches are two opposite switches with the same number (Ax, Bx, x=1, 2, . . . , N), the same voltages as in a conventional DAC are obtained. This is because identical potentials occur on the two lines 10, 11 and thus also at the output 12 of the voltage divider R1.

However, if two opposite switches with different numbers (Ax, By, x≠y) are activated, voltages that cannot occur at a conventional DAC are obtained.

The resistors R1, R2 are preferably fixedly predefined. It is initially assumed that R2=R1 holds true. If the switches A1 and B1 are activated, the output voltage is V1. If the switches A1 and B2 are activated, the output voltage is V1+(V2−V1)/2. If the switches A2 and B2 are activated, the output voltage is V2. Thus, one intermediate value more is obtained in comparison with the conventional DAC with the same resistor string (R-string). This intermediate value increases the resolution by one bit.

The voltage divider need not be designed as a 1:1 voltage divider. R2=2*R1 is assumed below. If the switches A1 and B1 are activated, the output voltage is V1. If the switches A1 and B2 are activated, the output voltage is V+(V2−V1)/4. If the switches A1 and B3 are activated, the output voltage is V1+(V3−V1)/4. If the switches A1 and B4 are activated, the output voltage is V1+(V4−V1)/4. If the switches A2 and B2 are activated, the output voltage is V2. In this way, three intermediate values more are obtained in comparison with a conventional DAC with the same resistor string (R-string) 7. This corresponds to an increase in the resolution by two bits. The example shows that increasing the resolution merely requires a suitable driving of the two decoder circuits 5, 6 and a suitable design of the voltage divider.

In the general case, $R2=(2^k-1)*R1$ holds true, where k=1, 2, . . . . Suitable control of the switches Ax, By where x, y=1, 2, . . . , N results in an increase in the resolution by k bits in comparison with the conventional DAC with the same resistor string (R-string). The number k of additionally obtained bits is limited in practice by the magnitude R2 and by the mismatch between R1 and R2.

As already explained, the first switches Ax and the second switches Bx in each case have a dedicated decoder circuit 5 and 6, respectively. These two decoder circuits 5, 6 are identical to the decoder circuit—known in the prior art—of a conventional R-string DAC with the same R-string and single taps. Consequently, the decoder circuits 5, 6 do not depend on the resolution of the DAC according to the invention, but rather on the number (N+1) of resistors in the resistor string (R-string) 7. In this case the logic circuit 1 carries out a division of the input signal (digital word) into two signals. The decoder circuits 5, 6 and also the logic circuit 1 are digital circuits and accordingly have a comparatively small space requirement.

It is pointed out that the circuit according to the invention could also be realized, in principle, by means of single taps. The taps Ax, x=1, 2, . . . , N, will be considered. For the output voltages Vx, x=1, 2, . . . , N, only one of the switches, namely Ax, is activated. In order to generate the voltage intermediate values, precisely two switches Ax, Ay, x≠y, are activated and the voltage divider R1, R2 is connected between the outputs of the two activated switches Ax, Ay. In this case, the double taps (more precisely: the switches B1, B2, . . . , BN) can be dispensed with, but a further logic circuit (e.g. a multiplexer) is required between the outputs of the switches A1, A2, . . . , AN and the inputs of the voltage divider R1, R2 in order to ensure that the inputs of the voltage divider R1, R2 are always connected to those switch outputs of the two activated switches Ax, Ay.

FIG. 2 shows the circuit diagram of a fully differential DAC according to the present invention. The same or comparably acting functional elements as in FIG. 1 are designated by the same reference symbols.

In this case, the logic circuit 1 divides the digital input signal into four signals that are forwarded via the data connections 3.1, 4.1 and 3.2, 4.2 to the decoder circuits 5.1, 6.1 and 5.2, 6.2, respectively. The decoder circuits 5.1, 5.2 correspond to the decoder circuit 5 in FIG. 1, while the decoder circuits 6.1, 6.2 correspond to the decoder circuit 6 in FIG. 1. The fully differential DAC thus comprises two DACs according to the invention in accordance with FIG. 1 with a common resistor string 7.1, 7.2, 7.3, . . . , 7N+1. In this respect, four switches Ax, Bx, A'x, B'x and two voltage dividers R1, R2, R'1, R'2 are required per tap. The control of the switches Ax, Bx, A'x, B'x is now performed such that only two switches Ax1, A'x2 and By1, B'y2, where x1, x2, y1, y2=1, . . . , N, are ever activated simultaneously on each side of the resistor string 7. In other words, precisely one switch is activated in each of the four switch groups Ax, Bx, A'x, B'x.

The resistors R1, R2 of the first voltage divider and R'1, R'2 of the second voltage divider may be designed in accordance with the explanations with respect to FIG. 1. The output voltage of the differential DAC is present between the divider output 12.1 of the first voltage divider R1, R2 and the divider output 12.2 of the second voltage divider R'1, R'2. The functioning of the circuit results from the functioning of the DAC described in FIG. 1.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A digital-to-analogue converter, comprising:
a resistor string with switchable taps associated therewith;
a decoder circuit configured to selectively connect two of the switchable taps to first and second terminals, respectively, in a manner dependent on a digital input signal; and
a voltage divider circuit coupled to the first and second terminals and configured to generate a divider voltage comprising a divided voltage difference between the first and second terminals as an analogue output voltage at an output of the voltage divider circuit, wherein the analogue output voltage is dependent on the divider voltage generated by the voltage divider, and wherein the voltage divider circuit is resistive.

2. The digital-to-analogue converter of claim 1, wherein:
the resistor string comprises a plurality of series-connected resistive elements having tap nodes therebetween, wherein each tap node comprises a double tap, wherein the tap node is switchably coupled to the first terminal via a first path and switchably coupled to the second terminal via a second path, and wherein the first and second paths are independently switchable, and
the decoder circuit comprises a first decoder circuit configured to connect or disconnect respective first paths of the double taps to the first terminal, and a second decoder circuit configured to connect or disconnect respective second paths of the double taps to the second terminal.

3. The digital-to-analogue converter of claim 2, wherein the first and second decoder circuits are substantially the same.

4. The digital-to-analogue converter of claim 1, wherein the digital-to-analogue converter comprises an integrated component of an integrated circuit.

5. The digital-to-analogue converter of claim 1, wherein the voltage divider comprises a fixed voltage division ratio.

6. The digital-to-analogue converter of claim 1, wherein the digital-to-analogue converter comprises a first digital-to-analogue converter, and further comprising a second digital-to-analogue converter, comprising:
a resistor string with switchable taps associated therewith;
a decoder circuit configured to selectively connect two of the switchable taps to first and second terminals, respectively in a manner dependent on the digital input signal; and
a voltage divider circuit coupled to the first and second terminals and configured to generate a divider voltage comprising a divided voltage difference between the first and second terminals, wherein the analogue output voltage is dependent on the divider voltage generated by the voltage divider,
wherein the first and second digital-to-analogue converters form a differential digital-to-analogue converter, wherein an analogue output voltage of the differential digital-to-analogue converter is dependent on a difference between the analogue output voltages of the first and second digital-to-analogue converters.

7. The digital-to-analogue converter of claim 1, wherein the voltage divider circuit comprises a first resistor connected to the first terminal and the output of the voltage divider circuit and a second resistor connected to the second terminal and the output of the voltage divider circuit.

8. A digital-to-analogue converter, comprising:
a resistive string comprising a plurality of series-connected resistive elements, the resistive string coupled between a first potential and a second potential, and wherein a node between each of the series-connected resistive elements comprises a tap;
first and second terminals;
a plurality of first paths, each switchably coupled between the first terminal and one of the plurality of taps, respectively;
a plurality of second paths, each switchably coupled between the second terminal and one of the plurality of taps, respectively;

a control circuit configured to receive a digital word as an input and output a plurality of control signals in response thereto, wherein the plurality of control signals are operative to selectively switchably couple one of the first paths from its respective tap to the first terminal and selectively switchably couple one of the second paths from its respective tap to the second terminal; and a voltage divider circuit coupled between the first and second terminals, and configured to output an analogue value comprising a divided voltage difference of potentials at the first and second terminals.

9. The digital-to-analogue converter of claim 8, wherein the control circuit comprises:
 a logic circuit configured to receive the digital word as an input and generate first and second intermediate control signals;
 a first decoder circuit coupled to the logic circuit, and configured to receive the first intermediate control signal and output a first control signal in response thereto, wherein the first control signal is operative to switchably couple one of the first paths between its respective tap and the first terminal; and
 a second decoder circuit coupled to the logic circuit, and configured to receive the second intermediate control signal and output a second control signal in response thereto, wherein the second control signal is operative to switchably couple one of the second paths between its respective tap and the second terminal.

10. The digital-to-analogue converter of claim 8, wherein each of the plurality of first and second paths comprises a switch coupled between its respective tap and its first or second terminals, respectively, and wherein the switch further comprises a control terminal coupled to the control circuit to receive a control signal thereat to selectively open and close the switch.

11. The digital-to-analogue converter of claim 10, wherein the switch comprise comprises a transistor.

12. The digital-to-analogue converter of claim 8, wherein the voltage divider circuit comprises first and second series-connected resistive elements coupled between the first and second terminals, and coupled together at an output node that comprises an output of the digital-to-analogue converter.

13. The digital-to-analogue converter of claim 12, wherein the first and second resistive elements of the voltage divider circuit have substantially the same resistance values.

14. The digital-to-analogue converter of claim 12, wherein the first and second resistive elements of the voltage divider circuit have resistance values R1 and R2, respectively, and wherein R2<R1*(2k−1), wherein k is an integer greater than zero.

15. A digital-to-analogue converter, comprising:
 a resistive string comprising a plurality of series-connected resistive elements, the resistive string coupled between a first potential and a second potential, and wherein a node between each of the series-connected resistive elements comprises a tap;
 first and second terminals;
 a plurality of paths, each switchably coupled between one of the first and second terminals and one of the plurality of taps, respectively;
 a control circuit configured to receive a digital word as an input and output a plurality of control signals in response thereto, wherein the plurality of control signals are operative to selectively switchably couple one of the paths from its respective tap to the first terminal and selectively switchably couple another one of the paths from its respective tap to the second terminal; and
 a voltage divider circuit coupled between the first and second terminals, and configured to output an analogue value comprising a divided voltage difference of potentials at the first and second terminals.

16. The digital-to-analogue converter of claim 15, wherein the control circuit comprises:
 a logic circuit configured to receive the digital word as an input and generate first and second intermediate control signals;
 a decoder circuit coupled to the logic circuit, and configured to receive the first and second intermediate control signals and output a first and second control signals in response thereto, wherein the first control signal is operative to switchably couple one of the first paths between its respective tap and the first terminal, and wherein the second control signal is operative to switchably couple another one of the first paths between its respective tap and the second terminal.

17. The digital-to-analogue converter of claim 15, wherein each of the plurality of first paths comprises a switch coupled between its respective tap and one of the first or second terminals, respectively, and wherein the switch further comprises a control terminal coupled to the control circuit to receive a control signal thereat to selectively open and close the switch.

18. The digital-to-analogue converter of claim 15, wherein the switch comprise comprises a transistor.

19. The digital-to-analogue converter of claim 15, wherein the voltage divider circuit comprises first and second series-connected resistive elements coupled between the first and second terminals, and coupled together at an output node that comprises an output of the digital-to-analogue converter.

20. The digital-to-analogue converter of claim 19, wherein the first and second resistive elements of the voltage divider circuit have substantially the same resistance values.

21. The digital-to-analogue converter of claim 19, wherein the first and second resistive elements of the voltage divider circuit have resistance values R1 and R2, respectively, and wherein R2=R1*(2k−1) wherein k is an integer greater than zero.

* * * * *

UNITED STATES PATENT AND TRADEMARK OFFICE
CERTIFICATE OF CORRECTION

| | | |
|---|---|---|
| PATENT NO. | : 7,079,062 B2 | Page 1 of 1 |
| APPLICATION NO. | : 11/036788 | |
| DATED | : July 18, 2006 | |
| INVENTOR(S) | : Georgi Nikolov Panov and Marco Bachhuber | |

It is certified that error appears in the above-identified patent and that said Letters Patent is hereby corrected as shown below:

Column 8, line 39: Please replace the dependent claim number "15" with the number --17--.

Signed and Sealed this

Fifth Day of December, 2006

JON W. DUDAS
*Director of the United States Patent and Trademark Office*